(12) United States Patent
Sandberg et al.

(10) Patent No.: US 12,489,449 B2
(45) Date of Patent: Dec. 2, 2025

(54) OSCILLATOR ARRANGEMENT WITH IMPROVED PHASE-NOISE PROPERTIES

(71) Applicant: Telefonaktiebolaget LM Ericsson (publ), Stockholm (SE)

(72) Inventors: Jan Sandberg, Frillesås (SE); Daniel Sjöberg, Mölndal (SE); Bengt Madeberg, Kungsbacka (SE); Mikael Hörberg, Torslanda (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 12 days.

(21) Appl. No.: 18/698,100

(22) PCT Filed: Oct. 4, 2021

(86) PCT No.: PCT/SE2021/050975
§ 371 (c)(1),
(2) Date: Apr. 3, 2024

(87) PCT Pub. No.: WO2023/059231
PCT Pub. Date: Apr. 13, 2023

(65) Prior Publication Data
US 2024/0405779 A1    Dec. 5, 2024

(51) Int. Cl.
*H03L 7/099*    (2006.01)
(52) U.S. Cl.
CPC .................... *H03L 7/099* (2013.01)

(58) Field of Classification Search
CPC ........................................................ H03L 7/099
(Continued)

(56) References Cited

U.S. PATENT DOCUMENTS 6,459,341 B1    10/2002  Oga
9,083,588 B1 *   7/2015  Xu ........................... H03D 5/00
(Continued)

FOREIGN PATENT DOCUMENTS

EP              3811460 B1    4/2021
WO         2005107076 A1    11/2005

OTHER PUBLICATIONS

International Search Report and Written Opinion dated May 17, 2022 for International Application No. PCT/SE2021/050975 filed Oct. 4, 2021; consisting of 13 pages.

*Primary Examiner* — Joseph Chang
(74) *Attorney, Agent, or Firm* — Weisberg I.P. Law, P.A.

(57) ABSTRACT

The present disclosure relates to oscillator arrangement comprising an output port adapted to output an output signal with an output frequency ($f_{out}$), an in loop oscillator that is adapted for an in loop oscillator frequency ($f_{osc}$) and an additional oscillator that is adapted for an additional oscillator frequency ($f_{oscA}$). The output frequency ($f_{out}$): exceeds the in loop oscillator frequency ($f_{osc}$) and the additional oscillator frequency ($f_{oscA}$), is dependent on both the in loop oscillator frequency ($f_{osc}$) and the additional oscillator frequency ($f_{oscA}$), and is adapted to control the in loop oscillator frequency ($f_{osc}$) via a feed-back loop.

20 Claims, 3 Drawing Sheets

(58) Field of Classification Search
USPC .......................................................... 331/1 R
See application file for complete search history.

(56) References Cited

U.S. PATENT DOCUMENTS

| | | | |
|---|---|---|---|
| 11,626,882 B1* | 4/2023 | An .......................... | H03L 7/099 327/16 |
| 2007/0013451 A1* | 1/2007 | Luzzatto ................. | H03L 7/185 331/16 |
| 2015/0311908 A1* | 10/2015 | Laaja ....................... | H03L 7/099 327/159 |
| 2017/0201262 A1* | 7/2017 | Bisanti .................... | H03L 7/093 |
| 2020/0235745 A1 | 7/2020 | Welp et al. | |
| 2022/0014227 A1* | 1/2022 | Chang .................. | H04B 1/0475 |

* cited by examiner

OSCILLATOR ARRANGEMENT WITH IMPROVED PHASE-NOISE PROPERTIES

CROSS-REFERENCE TO RELATED APPLICATION

This application is a Submission Under 35 U.S.C. § 371 for U.S. National Stage Patent Application of International Application Number: PCT/SE2021/050975, filed Oct. 4, 2021 entitled "OSCILLATOR ARRANGEMENT WITH IMPROVED PHASE-NOISE PROPERTIES," the entirety of which is incorporated herein by reference.

TECHNICAL FIELD

The present disclosure relates to an oscillator arrangement comprising an output port adapted to output an output signal with an output frequency.

BACKGROUND

Oscillators such as voltage controlled oscillators (VCO:s) are used for delivering a signal with a predetermined frequency, which may be adjustable. However, all oscillators that are set to a certain frequency tend to vary slightly around said frequency. This variation is known as phase noise.

In order to achieve low phase noise in an oscillator, it is well known that one of the main contributing parameters is the losses of the resonator, measured by its so-called Q value, where a high Q value results in low losses and low phase noise. There exists a vast number of different technologies for realizing an oscillator. A resonator can be built from microstrip or stripline structures on a substrate. It can also be built from discrete LC components, dielectric resonators, waveguide cavities or variants of these. The tuning element can be a varactor diode, ferroelectric material or some other variable reactance structure. The total Q value of a resonator structure depends on the combined resistive losses of the respective components.

Phase noise requirements are increasing as the frequency increases, VCO:s and integrated PLL (phase-locked loop) synths often operate at a frequency up to 20 GHz. An oscillator arrangement P100 with a phased-locked loop (PLL) P101, as illustrated in prior art FIG. 1, can use fractional dividers (not shown) and a reference input signal P102 with a frequency of for example 200 MHz that for example can be generated by means of crystal source. The oscillator arrangement P100 comprises an oscillator P103, a phase detector P104, a feedback loop P105, a loop filter P106 and an output filter P107. The reference input signal P102 is connected to the phase detector P104 that outputs a control signal to the oscillator P103 via the loop filter 106, for example a control voltage to a VCO. The oscillator P103 is connected to the phase detector P104 via the feedback loop P105, allowing the phase detector P104 to determine the control signal. The oscillator P103 is also connected to the output filter P107.

The phase noise decreases with about 6 dB when the frequency is divided by 2 and consequently increases with about 6 dB each time the frequency is doubled by 2, until the final desired frequency is reached. A user, however, expects the same phase noise performance and capacity at 10 GHz as at 40 GHz, and adding a ×4 frequency multiplier will degrade phase noise with about 12 dB. It is difficult to reach the phase noise requirements that are needed for high modulation schemes combined with a large tuning range.

The phase noise of a standard PLL solution is dependent of the Q value of a VCO where an increasing Q value makes the VCO more difficult to change in frequency. In this context, the phase noise performance at frequency division and multiplication follows a 20 log factor.

It is therefore desired to provide an uncomplicated and reliable oscillator arrangement with improved phase-noise properties.

SUMMARY

The object of the present disclosure is to provide an uncomplicated and reliable oscillator arrangement with improved phase-noise properties.

This object is obtained by means of an oscillator arrangement comprising an output port adapted to output an output signal with an output frequency, an in loop oscillator that is adapted for an in loop oscillator frequency and an additional oscillator that is adapted for an additional oscillator frequency. The output frequency exceeds the in loop oscillator frequency and the additional oscillator frequency, is dependent on both the in loop oscillator frequency and the additional oscillator frequency, and is adapted to control the in loop oscillator frequency via a feed-back loop.

This means that two oscillators are used to create an output signal with an output frequency, where the output frequency is fed back to control the in loop oscillator via the feed-back loop. A frequency lock can then be achieved by means of combined mixed signals with the in loop oscillator frequency and the additional oscillator frequency, and the final phase noise will be a combination of the two oscillators' performance. An important advantage is that the need for multiplying the in loop oscillator frequency to reach the output frequency is removed.

According to some aspects, the oscillator arrangement further comprises an input port adapted to receive a reference oscillator signal with an input frequency, a phase detector connected to the input port and to the in loop oscillator, a mixer that is connected to the output port and to the phase detector via the feedback loop. The feedback loop is adapted to feed the output frequency to the phase detector such that a phase-locked loop is formed, where the in loop oscillator and the additional oscillator both are connected to the mixer.

This means that the in loop oscillator and the phase detector will take care of the phase locking in the phase-locked loop, and in this manner deviation in the input frequency and the additional oscillator frequency, for example due to temperature changes and component ageing, can be compensated for.

According to some aspects, the in loop oscillator is a voltage-controlled oscillator (VCO). This means that an uncomplicated phase-locked loop can be formed, only standard components being used.

According to some aspects, the output frequency is a sum of the in loop oscillator frequency and the additional oscillator frequency. In this way, the output frequency can easily be filtered out.

According to some aspects, the additional oscillator is a free-running cavity oscillator. This means that the additional oscillator will have a relatively high Q value and consequently generate a relatively small amount of phase noise, and this means that the resulting output signal will at least have the same phase noise as the in loop oscillator frequency.

According to some aspects, the feedback loop comprises at least one feedback filter and/or at least one frequency divider. The feedback filter can for example be a band-pass filter that is adapted to clean up the signal in the feedback loop before the phase detector, and the frequency divider can be used to provide a suitable input to the phase detector.

According to some aspects, the additional oscillator is controllable my means of a movable wall or a movable dielectric structure. In this way, the additional oscillator frequency can be controlled.

According to some aspects, the in loop oscillator frequency falls below the additional oscillator frequency.

According to some aspects, the additional oscillator is a cavity oscillator that is comprised in a duplex filter design. This provides an efficient integration and allows the characteristics of such a cavity oscillator to be set by the filter component.

According to some aspects, the oscillator arrangement further comprises at least one set of a further output port adapted to output a further output signal with a further output frequency, and a further in loop oscillator that is adapted for a further in loop oscillator frequency that falls below the further output frequency. For each set, the further output frequency is dependent on both the further in loop oscillator frequency and the additional oscillator frequency, and is adapted to control the further in loop oscillator frequency via a further feed-back loop.

This means that the oscillator arrangement according to the above can be expanded for any number of output frequencies while only needing on common additional oscillator, and any such oscillator arrangement is associated with the above advantages.

According to some aspects, as an example of such an oscillator arrangement, the phase detector, the oscillator and the mixer are comprised in a transmitter frequency branch, where the mixer is connected to a transmitter output port. A set of a further in loop oscillator, a further phase detector and a further mixer are comprised in a receiver frequency branch, where the further mixer is connected to a receiver output port. The additional oscillator is common for the transmitter frequency branch and the receiver frequency branch.

This object is also obtained by means of method that are associated with the above advantages.

BRIEF DESCRIPTION OF THE DRAWINGS

The present disclosure will now be described more in detail with reference to the appended drawings, where.

DETAILED DESCRIPTION

Figure 1:
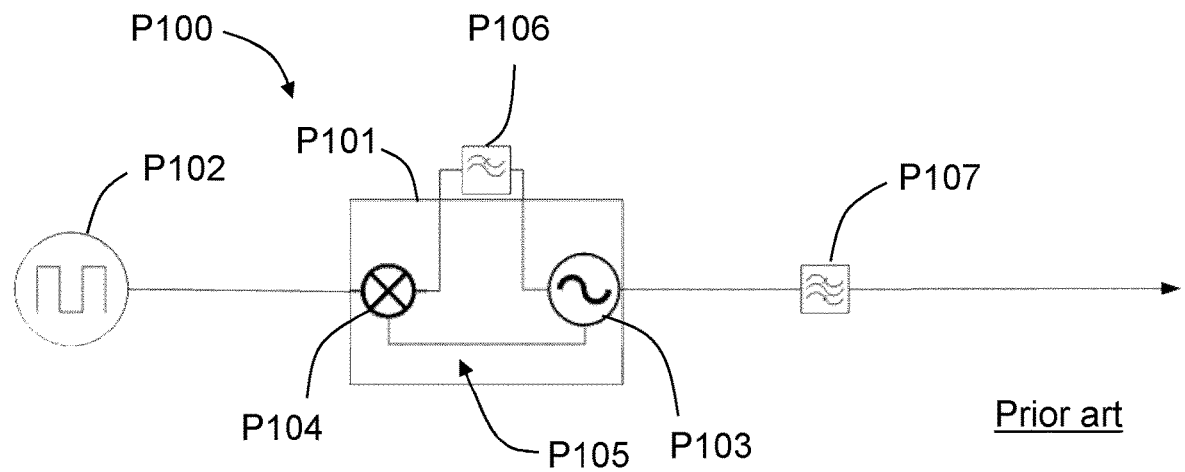
FIG. 1 shows simplified schematics for a prior art oscillator arrangement.

Aspects of the present disclosure will now be described more fully with reference to the accompanying drawings. The different devices, computer programs and methods disclosed herein can, however, be realized in many different forms and should not be construed as being limited to the aspects set forth herein. Like numbers in the drawings refer to like elements throughout.

The terminology used herein is for describing aspects of the disclosure only and is not intended to limit the invention. As used herein, the singular forms "a", "an" and "the" are intended to include the plural forms as well, unless the context clearly indicates otherwise.

Figure 2:
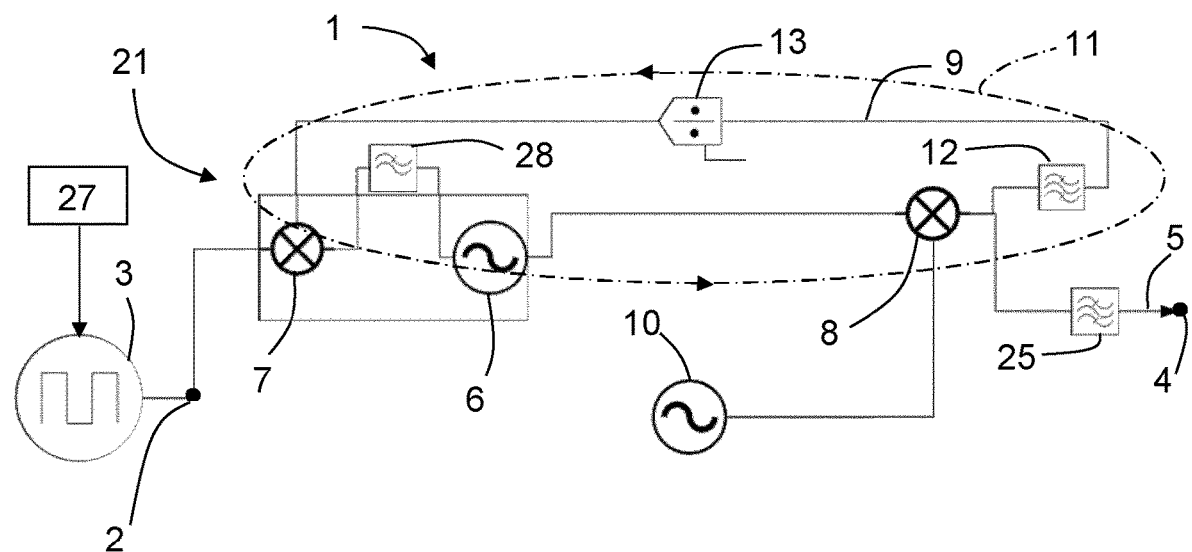
FIG. 2 shows simplified schematics for an oscillator arrangement according to a first example of the present disclosure.

With reference to FIG. 2, showing a first example, there is a first oscillator arrangement 1 comprising an output port 4 adapted to output an output signal 5 with an output frequency $f_{out}$, an in loop oscillator 6 that is adapted for an in loop oscillator frequency $f_{oscL}$ and an additional oscillator 10 that is adapted for an additional oscillator frequency $f_{oscA}$.

The output frequency $f_{out}$ exceeds the in loop oscillator frequency $f_{oscL}$ and the additional oscillator frequency $f_{oscA}$, and is dependent on both the in loop oscillator frequency $f_{oscL}$ and the additional oscillator frequency $f_{oscA}$. The output frequency $f_{out}$ is adapted to control the in loop oscillator frequency $f_{oscL}$ via a feed-back loop 9.

According to some aspects, the output frequency $f_{out}$ is a sum of the in loop oscillator frequency $f_{oscL}$ and the additional oscillator frequency $f_{oscA}$.

This means that two oscillators 6, 10 are used to create an output signal 5 with an output frequency $f_{out}$, where the output frequency $f_{out}$ is fed back to control one of the oscillators, the in loop oscillator 6, via the feed-back loop 9. A frequency lock can then be achieved by means of combined mixed signals with the in loop oscillator frequency $f_{oscL}$ and the additional oscillator frequency $f_{oscA}$. The final phase noise will be a combination of the two oscillators' performance. If for example, the additional oscillator 10 has phase noise characteristics that are better than the in loop oscillator 6, the in loop oscillator 6 will be the most contributing to the phase noise in the resulting output signal 5 with the output frequency $f_{out}$. The need for multiplying the in loop oscillator frequency to reach the output frequency $f_{out}$ is removed by means of the present disclosure.

According to some aspects, the oscillator arrangement 1 further comprises an input port 2 adapted to receive a reference oscillator signal 3 with an input frequency $f_{in}$, a phase detector 7 connected to the input port 2 and to the in loop oscillator 6, a mixer 8 that is connected to the output port 4 and to the phase detector 7 via the feedback loop 9. The feedback loop 9 is adapted to feed the output frequency $f_{out}$ to the phase detector 7 such that a phase-locked loop (PLL) 11 is formed, where the in loop oscillator 6 and the additional oscillator 10 both are connected to the mixer 8.

In this context, the phase detector 7 is of any known design that is suitable for function in a phase-locked loop 11 according to the above. According to some aspects, the reference oscillator signal 3 is generated in any suitable manner, for example by means of a crystal oscillator circuit 27.

The in loop oscillator 6 and the phase detector 7 will take care of the phase locking in the phase-locked loop 11, and in this manner deviation in the input frequency $f_{in}$ and the additional oscillator frequency $f_{oscA}$, for example due to temperature changes and component ageing can be compensated for.

According to some aspects, the in loop oscillator 6 is a voltage-controlled oscillator, VCO. This means that the in loop oscillator 6 can be controlled in a well-known manner by means of a control signal from the phase detector 7. Furthermore, in this manner, an uncomplicated phase-locked loop can be formed, only standard components being used.

According to some aspects, the additional oscillator 10 is a free-running cavity oscillator. This means that the additional oscillator 10 will have a relatively high Q value and consequently generate a relatively small amount of phase noise, and as mentioned above, this means that the resulting output signal 5 with the output frequency $f_{out}$ will at least have the same phase noise as the in loop oscillator frequency $f_{oscL}$. In other words, in order to reach an improved phase noise, a standard microwave/PLL solution with the in loop oscillator 6 is used together with a free running high Q high performance oscillator in the form of the cavity oscillator 10.

According to some aspects, the additional oscillator 10 is controllable my means of a movable wall or a movable dielectric structure, for example as shown in EP 3811460. In this way, the additional oscillator frequency $f_{oscA}$ can be controlled.

According to some aspects, the in loop oscillator frequency $f_{oscL}$ falls below the additional oscillator frequency $f_{oscA}$. According to some further aspects, the additional oscillator frequency $f_{oscA}$ lies relatively close to the output frequency $f_{out}$ compared to the in loop oscillator frequency $f_{oscL}$. As an example, the in loop oscillator frequency $f_{oscL}$ lies at 6 GHz, the additional oscillator frequency $f_{oscA}$ lies at 34 GHz and the output frequency $f_{out}$ is the sum of the in loop oscillator frequency $f_{oscL}$ and the additional oscillator frequency $f_{oscA}$, 40 GHz. The signal input into the feedback loop 9 is used for locking the in loop oscillator frequency $f_{oscL}$ to the reference oscillator signal 3.

According to some aspects, when generating the output frequency $f_{out}$, high mixing products may occur. If this is the case, and these high mixing products are input to the feedback loop 9, the error of the additional oscillator frequency $f_{oscA}$ is automatic compensated for. However, low side mixing products can be used to gain noise performance in the feedback part of the loop (i.e., reduce the needed division factor) if the frequency error is known and compensated for in the phase-locked loop 11. When it is known how the frequency error is divided between the oscillators 6, 10, it can be compensated for.

According to some aspects, the feedback loop 9 comprises at least one feedback filter 12 and/or at least one frequency divider 13. The feedback filter 12 can for example be a band-pass filter that is adapted to clean up the signal in the feedback loop 9 before the phase detector 7. In order to reach a suitable input to the phase detector 7, said frequency divider 13 may be needed. The frequency lock is achieved by allowing the PLL to work on the combined mixed signal of the oscillators 6, 10

According to some aspects, two or more different in loop oscillators can be used, for example one for transmission (Tx) and one for reception (Rx). For multiband products, such as 2 Tx and 2 Rx, several in loop oscillators can be used. In order to save cost and space, the additional oscillator 10 can be common for all in loop oscillators, as will be described in the following with reference to FIG. 3.

Figure 3:
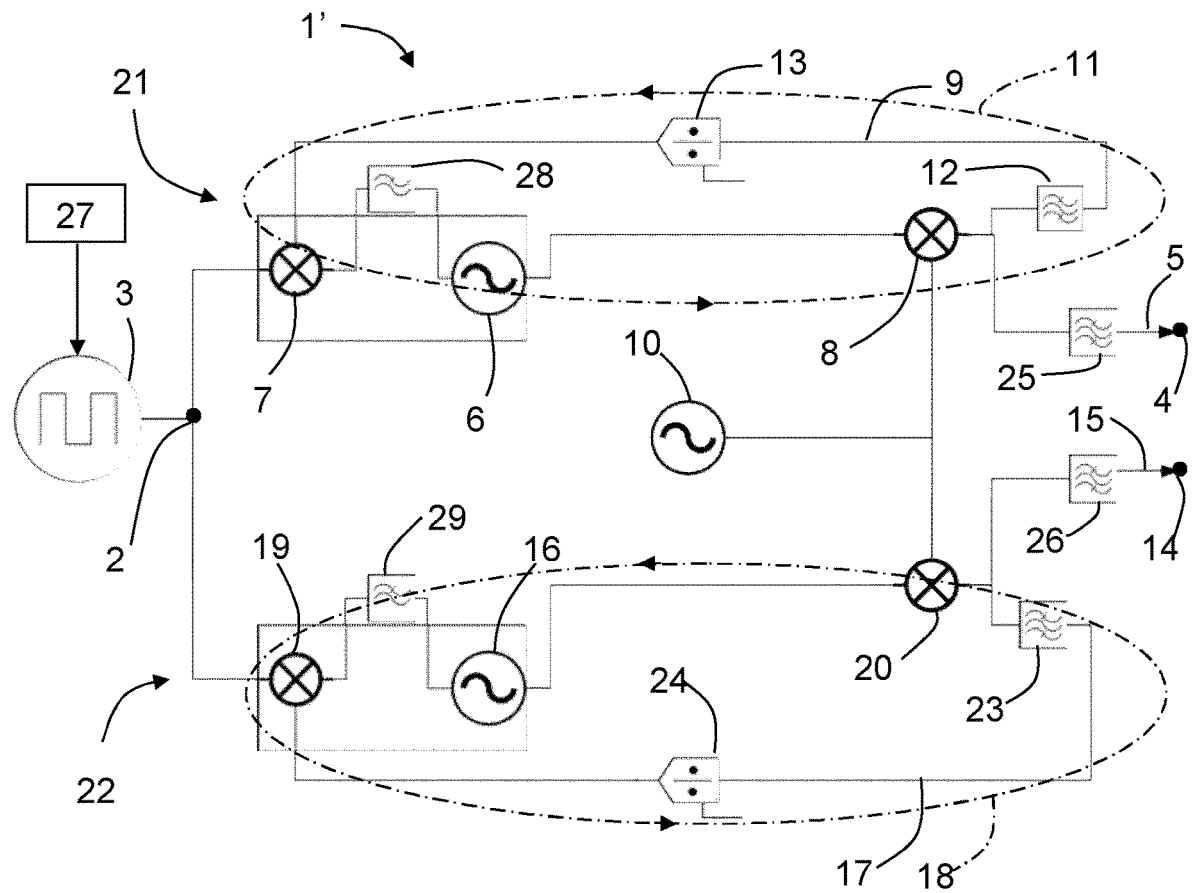
FIG. 3 shows simplified schematics for an oscillator arrangement according to a second example of the present disclosure.

With reference to FIG. 3, showing a second example, generally the oscillator arrangement 1' further comprises at least one set of a further output port 14 adapted to output a further output signal 15 with a further output frequency $f_{outF}$, and a further in loop oscillator 16 that is adapted for a further in loop oscillator frequency $f_{oscLF}$ that falls below the further output frequency $f_{outF}$. For each set, the further output frequency $f_{outF}$ is dependent on both the further in loop oscillator frequency $f_{oscLF}$ and the additional oscillator frequency $f_{oscA}$, and is adapted to control the further in loop oscillator frequency $f_{oscLF}$ via a further feed-back loop 17.

This means that the oscillator arrangement 1 described with reference to FIG. 2 can be expanded for any number of output frequencies while only needing on common additional oscillator 10.

According to some aspects, each of said set further comprises a further phase detector 19 and a further mixer 20, and for each set, the further phase detector 19 is connected to the input port 2 and to the further in loop oscillator 16, the further mixer 20 is connected to the further output port 14 and to the further phase detector 19 via the further feedback loop 17 that is adapted to feed the further output frequency $f_{outF}$ to the further phase detector 19 such that a further phase-locked loop 18 is formed, and the further in loop oscillator 16 and the additional oscillator 10 are both connected to the further mixer 20.

All phase detectors 7, 19 can be of any known design that is suitable for function in phase-locked loops 11, 18 according to the above. According to some aspects, the same reference oscillator signal 3 can be input to the phase detectors 7, 19 and used for as a reference for all PLL:s.

The above relates to a general case with any number of in loop oscillators and PLL:s. the specific example in FIG. 3 relates to an oscillator arrangement 1' with two in loop oscillators and two PLL:s, where the phase detector 7, the oscillator 8 and the mixer 8 are comprised in a transmitter frequency branch 21, the mixer 8 is connected to a transmitter output port 4. A set of a further in loop oscillator 16, a further phase detector 19 and a further mixer 20 are comprised in a receiver frequency branch 22, where the further mixer 20 is connected to a receiver output port 14. The additional oscillator 10 is common for the transmitter frequency branch 21 and the receiver frequency branch 22. In this manner, cost and space can be saved.

Furthermore, in the case of the oscillator arrangement 1, 1' is used in a radio unit with mechanical cavity duplex filters, a cavity can be added to a duplex filter design for the additional oscillator 10 that for example can be a free running cavity VCO. This provides an efficient integration and allows the characteristics of such a free running VCO to be set by the filter component.

According to some aspects, the same features as described for the oscillator arrangement 1 according to the first example are applicable for the oscillator arrangement 1' according to the second example, as will be discussed in the following.

According to some aspects, each further in loop oscillator 16 is a voltage-controlled oscillator (VCO). This means that each further in loop oscillator 6 can be controlled in a well-known manner by means of a control signal from each further phase detector 19.

According to some aspects, each further output frequency $f_{outF}$ is a sum of each further in loop oscillator frequency $f_{oscLF}$ and additional oscillator frequency $f_{oscA}$.

This means that two oscillators 6, 10 are used to create each further output signal 15 with a further output frequency $f_{outF}$, where each further output frequency $f_{outF}$ is fed back to control a corresponding further in loop oscillator 16, via a corresponding further feed-back loop 17. A frequency lock can then be achieved by means of combined mixed signals with the further in loop oscillator frequency $f_{oscLF}$ and the additional oscillator frequency $f_{oscA}$. The final phase noise will be a combination of the two oscillators' performance, in the same manner as discussed for the first example.

According to some aspects, each further feedback loop 17 comprises at least one further feedback filter 23 and/or at least one further frequency divider 24. These have the same functionality as discussed for the first example.

According to some aspects, the in loop oscillator frequency $f_{osc}$ and each further in loop oscillator frequency $f_{oscLF}$ are mutually different. This means that different frequency bands, such as Tx frequency bands and Rx frequency bands, can be handled by an oscillator arrangement according to the present disclosure with one common additional oscillator 10.

According to some aspects, each further in loop oscillator frequency $f_{oscLF}$ falls below the additional oscillator frequency $f_{oscA}$. According to some further aspects, the additional oscillator frequency $f_{oscA}$ lies relatively close to the output frequency $f_{out}$ compared to each further in loop oscillator frequency $f_{oscLF}$ as discussed for the first example.

According to some aspects, each output signal 5, 15 are configured to pass via a corresponding output filter 25, 26.

Figure 4:
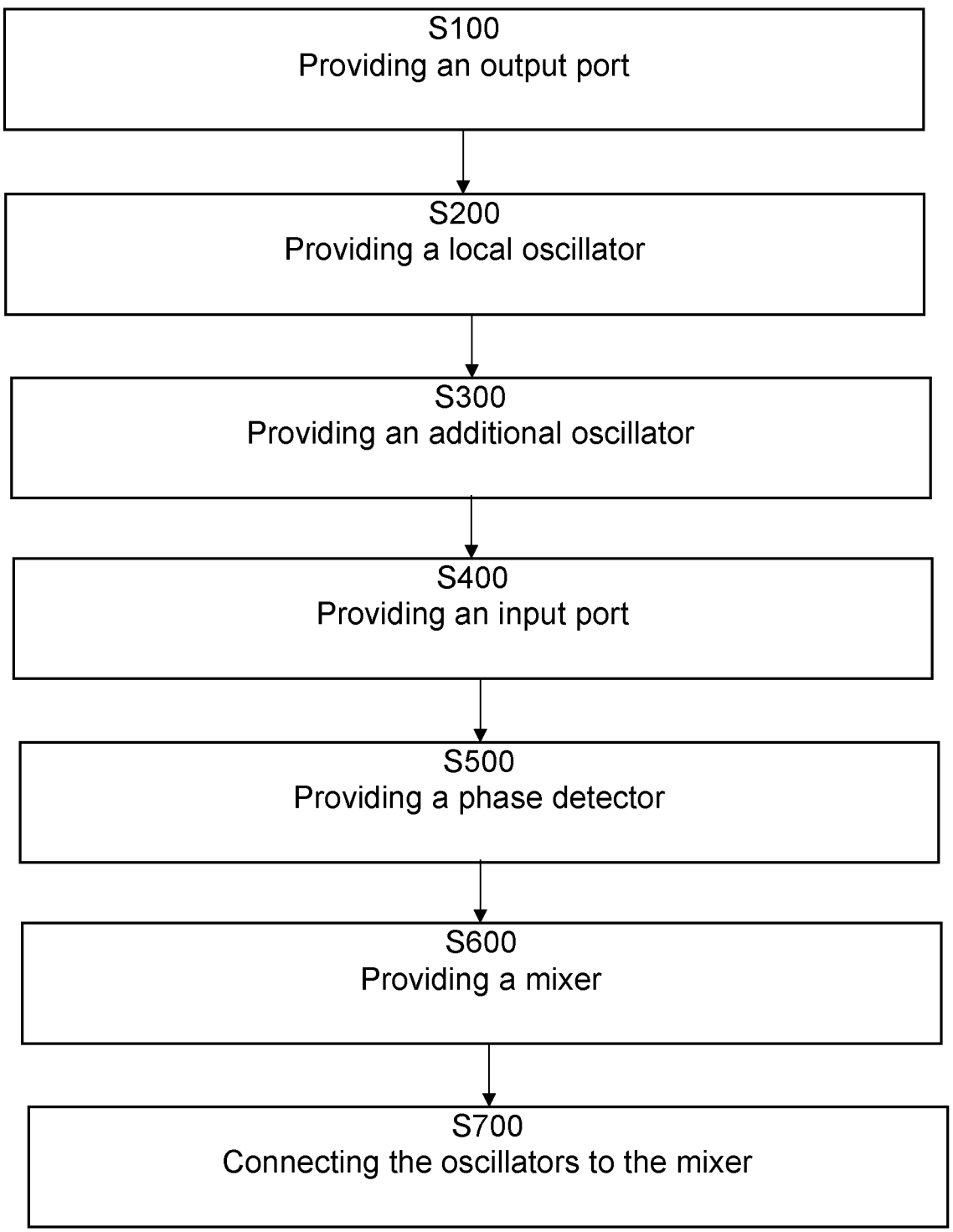
FIG. 4 shows flowcharts illustrating methods.

With reference to FIG. 4, the present disclosure also relates to a method for configuring an oscillator arrangement 1. The method comprises providing S100 an output port 4 adapted to output an output signal 5 with an output frequency $f_{out}$, providing S200 an in loop oscillator 6 that is adapted for an in loop oscillator frequency $f_{osc}$, and providing S300 an additional oscillator 10 that is adapted for an additional oscillator frequency $f_{oscA}$. The output frequency $f_{out}$ exceeds the in loop oscillator frequency $f_{osc}$ and the additional oscillator frequency $f_{oscA}$, is dependent on both the in loop oscillator frequency $f_{osc}$ and the additional oscillator frequency $f_{oscA}$, and is used for controlling the in loop oscillator frequency $f_{osc}$ via a feed-back loop 9.

According to some aspects, the method further comprises providing S400 an input port 2 adapted to receive a reference oscillator signal 3 with an input frequency $f_{in}$, and providing S500 a phase detector 7 connected to the input port 2 and to the in loop oscillator 6—The method also comprises providing S600 a mixer 8 that is connected to the output port 4 and to the phase detector 7 via the feedback loop 9 that is adapted to feed the output frequency $f_{out}$ to the phase detector 7 such that a phase-locked loop 11 is formed, and connecting S700 both the in loop oscillator 6 and the additional oscillator 10 to the mixer 8.

According to some aspects, the output frequency $f_{out}$ is a sum of the in loop oscillator frequency $f_{osc}$ and the additional oscillator frequency $f_{oscA}$.

According to some aspects, the in loop oscillator frequency $f_{oscL}$ falls below the additional oscillator frequency $f_{oscA}$.

The present disclosure is not limited to the above, but may vary freely within the scope of the appended claims. For example the additional oscillator 10 can be a fixed or DAC (Digital to Analogue Converter) controlled VCO.

According to some aspects, one or more VCO:s can be in the form of a voltage-controlled crystal oscillator, (VCXO).

It is of course to use several separate oscillator arrangements 1 of the type according to FIG. 1, for example for Tx and Rx branches. According to some aspects, for an oscillator arrangement 1' according to FIG. 3 that is adapted for two or more different output signals 5, 15, two or more crystal oscillator circuit 27 can be used for generating two or more corresponding reference oscillator signals.

According to some aspects, between each phase detector 7, 19 and in loop oscillator 6, 16 there is a corresponding loop filter 28, 29.

The invention claimed is:

1. An oscillator arrangement comprising:
    an output port configured to output an output signal with an output frequency ($f_{out}$);
    an in loop oscillator that is configured for an in loop oscillator frequency ($f_{osc}$);
    an additional oscillator that is configured for an additional oscillator frequency ($f_{oscA}$), the output frequency ($f_{out}$) exceeding the in loop oscillator frequency ($f_{osc}$) and the additional oscillator frequency ($f_{oscA}$);

being dependent on both the in loop oscillator frequency ($f_{osc}$) and the additional oscillator frequency ($f_{oscA}$); and
    being configured to control the in loop oscillator frequency ($f_{osc}$) via a feed-back loop;
    a mixer configured to multiply an output of the in loop oscillator by an output of the additional oscillator to produce an output that includes the output frequency ($f_{out}$);
    a feedback filter in the feedback loop connected to the output of the mixer and configured to filter the signal delivered to the feedback loop; and
    an output filter connected to the output of the mixer to filter out harmonics from the output of the mixer and to output the output frequency ($f_{out}$).

2. The oscillator arrangement according to claim 1, further comprising an input port configured to receive a reference oscillator signal with an input frequency ($f_{in}$), a phase detector connected to the input port and to the in loop oscillator, a mixer that is connected to the output port and to the phase detector via the feedback loop that is configured to feed the output frequency ($f_{out}$) to the phase detector such that a phase-locked loop is formed, where the in loop oscillator and the additional oscillator both are connected to the mixer.

3. The oscillator arrangement according to claim 1, wherein the in loop oscillator is a voltage-controlled oscillator, VCO.

4. The oscillator arrangement according to claim 1, wherein the output frequency ($f_{out}$) is a sum of the in loop oscillator frequency ($f_{osc}$) and the additional oscillator frequency ($f_{oscA}$).

5. The oscillator arrangement according to claim 1, wherein the additional oscillator is a free-running cavity oscillator.

6. The oscillator arrangement according to claim 1, wherein the feedback loop comprises one or both of:
    at least one feedback filter; and
    at least one frequency divider.

7. The oscillator arrangement according to claim 1, wherein the additional oscillator is controllable by means of a movable wall or a movable dielectric structure.

8. The oscillator arrangement according to claim 1, wherein the in loop oscillator frequency ($f_{oscL}$) falls below the additional oscillator frequency ($f_{oscA}$).

9. The oscillator arrangement according to claim 1, further comprising at least one set of:
    a further output port configured to output a further output signal with a further output frequency ($f_{outF}$); and
    a further in loop oscillator that is adapted for a further in loop oscillator frequency ($f_{oscLF}$) that falls below the further output frequency ($f_{outF}$); and
    where, for each set, the further output frequency ($f_{outF}$) is dependent on both the further in loop oscillator frequency ($f_{oscLF}$) and the additional oscillator frequency ($f_{oscA}$), and is configured to control the further in loop oscillator frequency ($f_{oscLF}$) via a further feed-back loop.

10. The oscillator arrangement according to claim 9, each of the set further comprising a further phase detector and a further mixer, and where for each set:
    the further phase detector is connected to the input port and to the further in loop oscillator;
    the further mixer is connected to the further output port and to the further phase detector via the further feedback loop that is configured to feed the further output frequency ($f_{outF}$) to the further phase detector such that a further phase-locked loop is formed; and the further in loop oscillator and the additional oscillator are both connected to the further mixer.

11. The oscillator arrangement according to claim 10, wherein the phase detector, the oscillator and the mixer are comprised in a transmitter frequency branch where the mixer is connected to a transmitter output port, and where a set of a further in loop oscillator, a further phase detector and a further mixer are comprised in a receiver frequency branch, where the further mixer is connected to a receiver output port, where the additional oscillator is common for the transmitter frequency branch and the receiver frequency branch.

12. The oscillator arrangement according to claim 9, wherein each further in loop oscillator is a voltage-controlled oscillator, VCO.

13. The oscillator arrangement according to claim 9, wherein each further output frequency ($f_{outF}$) is a sum of each further in loop oscillator frequency ($f_{oscLF}$) and additional oscillator frequency ($f_{oscA}$).

14. The oscillator arrangement according to claim 9, wherein each further feedback loop comprises one or both of:
at least one further feedback filter; and
at least one further frequency divider.

15. The oscillator arrangement according to claim 9, wherein the in loop oscillator frequency ($f_{osc}$) and each further in loop oscillator frequency ($f_{oscLF}$) are mutually different.

16. The oscillator arrangement according to claim 1, wherein the additional oscillator is a cavity oscillator that is comprised in a duplex filter design.

17. A method for configuring an oscillator arrangement, the method comprising:
providing an output port adapted to output an output signal with an output frequency ($f_{out}$);
providing an in loop oscillator that is adapted for an in loop oscillator frequency ($f_{osc}$); and providing an additional oscillator that is adapted for an additional oscillator frequency ($f_{oscA}$), the output frequency ($f_{out}$):
exceeding the in loop oscillator frequency ($f_{osc}$) and the additional oscillator frequency ($f_{oscA}$);
being dependent on both the in loop oscillator frequency ($f_{osc}$) and the additional oscillator frequency ($f_{oscA}$); and
being used for controlling the in loop oscillator frequency ($f_{osc}$) via a feed-back loop; and
providing a mixer configured to multiply an output of the in loop oscillator by an output of the additional oscillator to produce an output that includes the output frequency ($f_{out}$);
providing a feedback filter in the feedback loop connected to the output of the mixer and configured to filter the signal delivered to the feedback loop; and
providing an output filter connected to the output of the mixer to filter out harmonics from the output of the mixer and to output the output frequency ($f_{out}$).

18. The method according to claim 17, further comprising:
providing an input port configured to receive a reference oscillator signal with an input frequency ($f_{in}$);
providing a phase detector connected to the input port and to the in loop oscillator,
providing a mixer that is connected to the output port and to the phase detector via the feedback loop that is configured to feed the output frequency ($f_{out}$) to the phase detector such that a phase-locked loop is formed; and
connecting both the in loop oscillator and the additional oscillator to the mixer.

19. The method according to claim 17, wherein the output frequency ($f_{out}$) is a sum of the in loop oscillator frequency ($f_{osc}$) and the additional oscillator frequency ($f_{oscA}$).

20. The method according to claim 17, wherein the in loop oscillator frequency ($f_{oscL}$) falls below the additional oscillator frequency ($f_{oscA}$).

* * * * *